United States Patent
Inoue et al.

(10) Patent No.: US 8,492,449 B2
(45) Date of Patent: Jul. 23, 2013

(54) PHOTOSENSITIVE RESIN COMPOSITION, PRINTING PLATE PRECURSOR AND FLEXOGRAPHIC PRINTING PLATE

(75) Inventors: Daisuke Inoue, Kasugai (JP); Koki Matsuoka, Komaki (JP)

(73) Assignee: Tokai Rubber Industries, Ltd., Aichi (JP)

( * ) Notice: Subject to any disclaimer, the term of this patent is extended or adjusted under 35 U.S.C. 154(b) by 0 days.

(21) Appl. No.: 13/558,682

(22) Filed: Jul. 26, 2012

(65) Prior Publication Data

US 2012/0288682 A1 Nov. 15, 2012

Related U.S. Application Data

(63) Continuation of application No. PCT/JP2010/059173, filed on May 31, 2010.

(30) Foreign Application Priority Data

Mar. 25, 2010 (JP) ................................ 2010-070159

(51) Int. Cl.
*C08F 2/46* (2006.01)

(52) U.S. Cl.
USPC .............................................................. 522/1

(58) Field of Classification Search
USPC .............................................................. 522/1
See application file for complete search history.

(56) References Cited

U.S. PATENT DOCUMENTS

| | | | |
|---|---|---|---|
| 5,902,714 A * | 5/1999 | Reimers | 430/287.1 |
| 6,197,479 B1 * | 3/2001 | Tanaka et al. | 430/281.1 |
| 6,989,226 B2 * | 1/2006 | Araki et al. | 430/287.1 |
| 7,338,749 B2 * | 3/2008 | Kunita | 430/306 |
| 2008/0072780 A1 * | 3/2008 | Sonokawa et al. | 101/467 |

FOREIGN PATENT DOCUMENTS

| | | | |
|---|---|---|---|
| JP | 2000-155417 | * | 6/2000 |
| JP | 2001-183813 | * | 7/2001 |
| JP | 2005-010252 | * | 6/2003 |
| JP | 2004-170597 | | 6/2004 |
| JP | 2004-295120 | * | 10/2004 |
| JP | 2005-062711 | * | 3/2005 |
| JP | 2005-331811 | * | 12/2005 |
| JP | 2008-058957 | * | 3/2008 |

OTHER PUBLICATIONS

"Naphthalenesulfonic acid salt (Na, K, Li, Ca) formaldeyde polycondensation", 14906 no Kagaku Shohin, The Chemical Daily Co., Ltd., Jan. 24, 2006, pp. 1398-1399.
Search report from International Application No. PCT/JP2010/059173, mail date is Jun. 22, 2010.

* cited by examiner

*Primary Examiner* — Ling Choi
*Assistant Examiner* — Jessica E Whiteley
(74) *Attorney, Agent, or Firm* — Greenblum & Bernstein, P.L.C.

(57) ABSTRACT

Disclosed is a photosensitive resin composition that provides an excellent water developability, drying property, and image reproducibility. The photosensitive resin composition comprises a water-dispersible latex (A), a rubber (B), a surfactant (C), a photopolymerizable monomer (D), and a photopolymerization initiator (E). A ratio of a mass of the component (C) to a total mass of the components (A), (B), and (C) is within a range of 0.1 to 20%. A ratio of a mass of the component (A) to a total mass of the components (A) and (B) is within 20 to 90%. A size of a dispersed phase consisting mainly of the component (B) is 10 μm or smaller.

23 Claims, 2 Drawing Sheets

5 μm

5 μm

5 μm

5 μm

5 μm

5 μm

5 μm

PHOTOSENSITIVE RESIN COMPOSITION, PRINTING PLATE PRECURSOR AND FLEXOGRAPHIC PRINTING PLATE

CLAIM FOR PRIORITY

This application is a continuation of PCT/JP2010/059173 filed May 31, 2010, and claims the priority benefit of Japanese Application No. 2010-070159, filed Mar. 25, 2010, the contents of which is expressly incorporated by reference in its entirety.

TECHNICAL FIELD

The present invention relates to a photosensitive resin composition, a printing plate precursor, and a flexographic printing plate.

BACKGROUND ART

Conventionally, a printing plate is used for relief printing, intaglio printing, and lithographic printing on an object to be printed such as a packing material, a label, and a magazine. A relief printing plate is used for the relief printing. As a relief printing plates, a flexographic printing plate can be applied to printing on various objects to be printed because of its flexibility.

A flexographic printing plate precursor comprises a photosensitive layer made of a photosensitive resin composition on a substrate consisting such as of a PET resin. A flexographic printing plate is prepared by forming a relief image on the precursor. To form the relief image, the photosensitive layer is exposed to ultraviolet rays through a negative film contacted with the photosensitive layer and then uncured portions of the photosensitive layer are removed. Recently, the relief image is often formed by water development, in which the uncured portions are removed via the medium of water.

As an example of a water-developable photosensitive resin composition, PTL1 discloses a photosensitive resin composition comprising a water-dispersible latex, a photopolymerizable monomer, a rubber, and a photopolymerization initiator. As another example, PTL2 discloses a photosensitive resin composition comprising a water-soluble or water-swelling polymer, an ethylenic unsaturated compound, a photopolymerization initiator, and a sulfonate surfactant.

CITATION LIST

Patent Literature

PTL1: JP 4211141B
PTL2: JP 2005-331811 A

SUMMARY OF INVENTION

Technical Problem

However, since most of the components of the photosensitive resin composition disclosed in PTL1 have low water solubility and/or low water permeability, a developing process requires a long time. A long developing time may reduce image reproducibility as well as workability, since a fine dot may be lost from a printing plate when the surface of a printing plate precursor is rubbed by a brush for a long time in the development process for removal of the uncured portion.

Meanwhile, the photosensitive resin composition disclosed in PTL2 contains the surfactant in order to shorten a developing time, which is actually effective for shortening of the developing time. However, since the main component of the photosensitive resin composition is the water-soluble or water-swelling polymer, drying of the composition after development may require too much time for the composition to be practical for use.

In addition, if the surfactant disclosed in PTL2 is simply added into the mixture of the water-dispersible latex, photopolymerizable monomer, rubber, and photopolymerization initiator containing the photosensitive resin composition disclosed in PTL1, image reproducibility with which a fine dot on a negative film is reproduced may be low.

Thus, the conventional photosensitive resin compositions do not have a sufficient water developability, drying property, and image reproducibility at the same time.

An object of the present invention is to provide a photosensitive resin composition excellent in water developability, drying property, and image reproducibility. Another object of the present invention is to provide a printing plate precursor comprising the photosensitive resin composition and a flexographic printing plate made from the printing plate precursor.

Solution to Problem

As a result of keen examination by the present inventors, they found that a dispersion state in a photosensitive resin composition containing specific components at a specific content ratio has large influence on the image reproducibility of the composition, and they completed the present invention.

In order to solve the problem, the photosensitive resin composition according to a preferred embodiment of the present invention contains a water-dispersible latex (A), a rubber (B), a surfactant (C), a photopolymerizable monomer (D), and a photopolymerization initiator (E), wherein a ratio of a mass of the component (C) to a total mass of the components (A), (B), and (C) is within a range of 0.1 to 20%, a ratio of a mass of the component (A) to a total mass of the components (A) and (B) is within 20 to 90%, and a size of a dispersed phase consisting mainly of the component (B) is 10 μm or smaller.

It is preferable that the component (C) is a sulfonate surfactant. It is also preferable that the photosensitive resin composition further contains 0.1 to 30 mass % of a plasticizer (F). It is also preferable that the component (B) is one or more rubbers selected from butadiene rubbers and nitrile rubbers.

In another aspect of the present invention, a printing plate precursor according to a preferred embodiment of the present invention comprises a photosensitive layer made of the above-described photosensitive resin composition.

Yet, in another aspect of the present invention, a flexographic printing plate according to a preferred embodiment of the present invention is made from the above-described printing plate precursor.

Advantageous Effects of Invention

Since the photosensitive resin composition according to the preferred embodiment of the present invention contains the water-dispersible latex (A), the rubber (B), the surfactant (C), the photopolymerizable polymer (D), and the photopolymerization initiator (E) at the specific content ratio, and since the size of the dispersed phase consisting mainly of the component (B) is 10 μm or smaller, the composition has an excellent water developability, an excellent drying property, and an excellent image reproducibility.

When the component (C) is the sulfonate surfactant, the photosensitive resin composition has a more excellent water developability.

When the photosensitive resin composition further contains 0.1 to 30 mass % of the plasticizer (F), swelling of the composition by an ink such as a solvent ink and a UV ink is suppressed, whereby the composition is excellent also in ink resistance.

When the component (B) consists of the specific kinds of rubber, the photosensitive resin composition has a more excellent image reproducibility.

Meanwhile, since the printing plate precursor according to the preferred embodiment of the present invention comprises the photosensitive layer made of the above-described photosensitive resin composition, the printing plate precursor has an excellent water developability, an excellent drying property, and an excellent image reproducibility.

Meanwhile, since the flexographic printing plate according to the preferred embodiment of the present invention is made from the printing plate precursor, the flexographic printing plate has an excellent image reproducibility.

BRIEF DESCRIPTION OF DRAWINGS

FIG. 1 is a set of surface observation images of the photosensitive resin compositions according to Examples.

FIG. 2 is a set of surface observation images of the photosensitive resin compositions according to Comparative Examples.

DESCRIPTION OF EMBODIMENTS

Figure 1A:
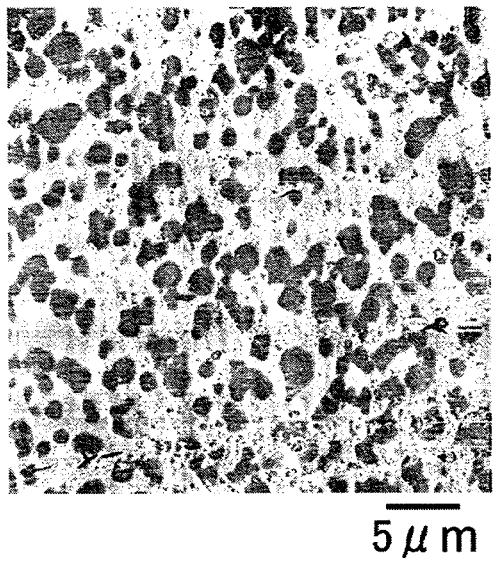
FIGS. 1A, 1B, 1C, and 1D correspond to Example 1, 4, 7, and 8, respectively.
Figure 1B:
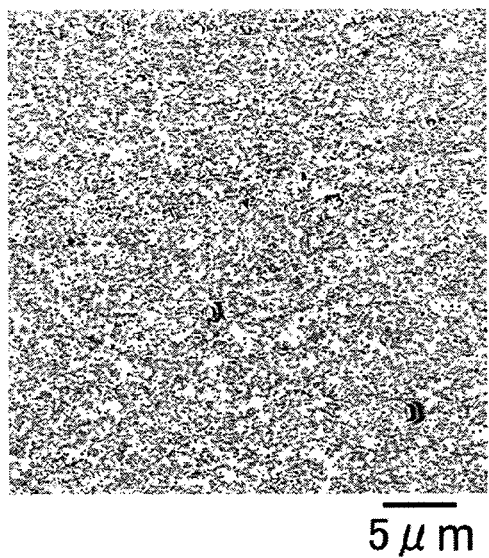
Figure 1C:
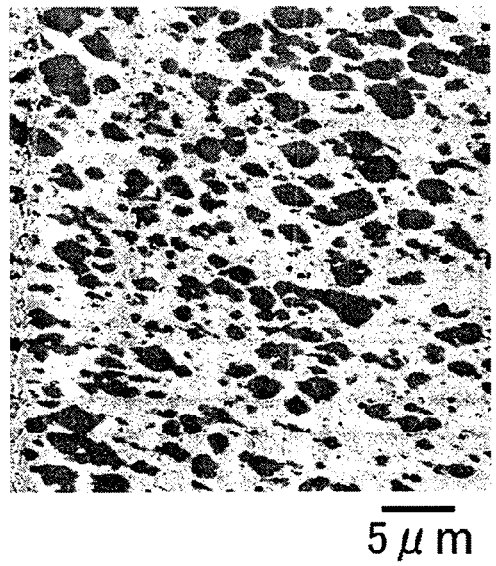
Figure 1D:
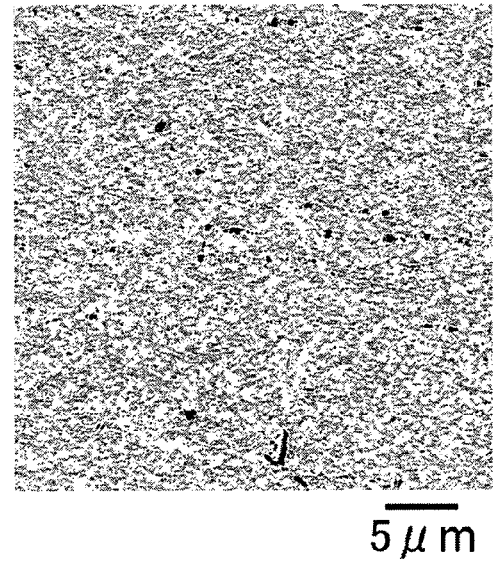

A detailed description of preferred embodiments of the present invention will now be provided.

A photosensitive resin composition according to the preferred embodiment of the present invention comprises a water-dispersible latex (A), a rubber (B), a surfactant (C), a photopolymerizable monomer, and photopolymerization initiator (E) at a specific content ratio. The photosensitive resin composition is used preferably for preparation of a photosensitive layer of a printing plate precursor developable with water or an aqueous developing solution.

The water-dispersible latex (A) is derived from a water dispersion of latex, in which polymer particles as a dispersoid are dispersed in water. The polymer particles are obtained by removing water from the water dispersion of latex. The water-dispersible latex imparts water developability to the photosensitive resin composition.

Examples of the water-dispersible latex include a latex polymer that is dispersible in water such as polybutadiene latex, a natural rubber latex, a styrene-butadiene copolymer latex, an acrylonitrile-butadiene copolymer latex, a polychloroprene latex, a polyisoprene latex, a polyurethane latex, a methyl methacrylate-butadiene copolymer latex, an acrylate-methyl methacrylate-butadiene copolymer latex, a vinylpyridine polymer latex, a butyl polymer latex, a thiokol polymer latex, and an acrylate polymer latex, as well as a copolymer of one of the above-described latex polymers and another component such as acrylic acid and methacrylic acid. They may be used singly or in combination.

Among them, a water-dispersible latex that contains a butadiene skeleton or an isoprene skeleton in the molecular chain is preferable in view of hardness. Specific examples of the preferable latex include a polybutadiene latex, a styrene-butadiene copolymer latex, an acrylonitrile-butadiene copolymer latex, a methyl methacrylate-butadiene copolymer latex, an acrylate-methyl methacrylate-butadiene copolymer latex, and a polyisoprene latex.

The rubber (B) acts to increase the rubber elasticity of the photosensitive resin composition, whereby printing on various objects to be printed with a printing plate comprising the composition is facilitated. Examples of the rubber include a butadiene rubber (BR), a nitrile rubber (NBR), an acryl rubber, an epichlorhydrin rubber, a urethane rubber, an isoprene rubber, a styrene-isoprene rubber, a styrene-butadiene rubber, an ethylene-propylene copolymer, and a chlorinated polyethylene. They may be used singly or in combination.

Among them, the butadiene rubber (BR) and the nitrile rubber (NBR) are preferable in view of improving the water developability, drying property, and image reproducibility of the photosensitive resin composition. The butadiene rubber (BR) is more preferable, since the butadiene rubber component is dispersed in the photosensitive resin composition so well that the composition is excellent in reproducing fine structures and thus has a more excellent image reproducibility.

The surfactant (C) acts to improve the water developability of the photosensitive resin composition. Examples of the surfactant include a cationic surfactant, an anionic surfactant, and a nonionic surfactant. Among them, the anionic surfactant is preferable.

Examples of the anionic surfactant include an aliphatic carboxylate such as sodium laurate and sodium oleate; a sulfate ester salt of a higher alcohol such as sodium lauryl sulfate, sodium cetyl sulfate, and sodium oleyl sulfate; a polyoxyethylene alkyl ether sulfate ester salt such as a sodium polyoxyethylene lauryl ether sulfate; a polyoxyethylene alkylaryl ether sulfate ester salt such as a sodium polyoxyethylene octylphenyl ether sulfate and a sodium polyoxyethylene nonylphenyl ether sulfate; an alkyl sulfate salt such as an alkyldiphenyl ether disulfonate salt, sodium dodecylbenzene sulfonate, and a sodium dialkyl sulfosuccinate; an alkylaryl sulfonate salt such as an alkyl disulfonate salt, sodium dodecylbenzene sulfonate, sodium dibutylnaphthalene sulfonate, and sodium triisopropylnaphthalene sulfonate; a phosphate ester salt of a higher alcohol such as disodium lauryl phosphate and sodium dilauryl phosphate; and a phosphate ester salt of polyoxyethylene alkyl ether such as a disodium polyoxyethylene lauryl ether phosphate and a sodium polyoxyethylene dilaurylether phosphate. They may be used singly or in combination. Though sodium salts are presented above as the examples of the surfactant, the surfactant contained in the photosensitive resin composition is not limited to the sodium salts, calcium salts and ammonium salts bring the same effect.

Among above examples of the anionic surfactant, a sulfonate surfactant such as the alkyl sulfonate and the alkylaryl sulfonate is more preferable in view of a more excellent water developability.

The photopolymerizable monomer (D) cures or crosslinks the photosensitive resin composition. Examples of the photopolymerizable monomer include an ethylenic unsaturated compound. Examples of the ethylenic unsaturated compounds include a (meth)acrylic monomer, a (meth)acrylic oligomer, and a (meth)acrylic modified polymer. Examples of a (meth) acrylic modified polymer include (meth) acrylic modified butadiene rubber and a (meth)acrylic modified nitrile rubber.

The ethylenic unsaturated compound may contain only one ethylenic unsaturated bond or may contain two or more ethylenic unsaturated bonds.

Examples of the ethylenic unsaturated compound containing only one ethylenic unsaturated bond include a (meth)acrylate containing a hydroxyl group such as 2-hydroxyethyl (meth)acrylate, 2-hydroxypropyl(meth)acrylate, 2-hydroxybutyl(meth)acrylate, 3-chloro-2-hydroxypropyl (meth)acrylate, and β-hydroxy-β'-(meth)acryloyloxyethyl phthalate; an alkyl(meth)acrylate such as methyl(meth)acrylate, ethyl(meth)acrylate, propyl(meth)acrylate, butyl(meth)acrylate, isoamyl(meth)acrylate, 2-ethylhexyl(meth)acrylate, lauryl(meth)acrylate, and stearyl(meth)acrylate; a cycloalkyl(meth)acrylate such as cyclohexyl(meth)acrylate; a halogenated alkyl(meth)acrylate such as chloroethyl(meth)acrylate and chloropropyl(meth)acrylate; an alkoxyalkyl (meth)acrylate such as methoxyethyl(meth)acrylate, ethoxyethyl(meth)acrylate, and butoxyethyl(meth)acrylate; a phenoxyalkyl(meth)acrylate such as phenoxyethyl(meth)acrylate and nonylphenoxyethyl(meth)acrylate; an alkoxyalkylene glycol(meth)acrylate such as ethoxydiethylene glycol (meth)acrylate, methoxytriethylene glycol(meth)acrylate, and methoxydipropylene glycol(meth)acrylate; 2,2-dimethylaminoethyl(meth)acrylate; 2,2-diethylaminoethyl (meth)acrylate; 2-hydroxyethyl(meth)acrylate; and 3-chloro-2-hydroxypropyl(meth)acrylate.

Examples of the ethylenic unsaturated compound containing two or more ethylenic unsaturated bonds include an alkyldioldi(meth)acrylate such as 1,9-nonanedioldi(meth)acrylate; a polyethylene glycoldi(meth)acrylate such as diethyleneglycoldi(meth)acrylate; a polypropylene glycoldi (meth)acrylate such as dipropyleneglycoldi(meth)acrylate; trimethylolpropane tri(meth)acrylate; pentaerythritol tri (meth)acrylate; pentaerythritol tetra(meth)acrylate; glycerol tri(meth)acrylate; a polyvalent (meth)acrylate synthesized by an addition reaction of a compound having an ethylenic unsaturated bond and an active hydrogen such as an unsaturated carboxylic acid and an unsaturated alcohol to ethylene glycol diglycidyl ether; a polyvalent (meth)acrylate synthesized by an addition reaction of a compound having an active hydrogen such as a carboxylic acid and an amine to an unsaturated epoxy compound such as glycidyl(meth)acrylate; a polyvalent (meth)acrylamide such as methylene-bis-(meth)acrylamide; and a polyvalent vinyl compound such as divinylbenzene.

The photopolymerization initiator (E) is not limited specifically, and it is essential only that the photopolymerization initiator should initiate photopolymerization of the photopolymerizable monomer. Examples of the photopolymerization initiator include an alkylphenone type, an acetophenone type, a benzoine ether type, a benzophenone type, a thioxanthone type, an anthraquinone type, a benzyl type, and a biacetyl type photopolymerization initiators. More specific examples of the photopolymerization initiator include benzyldimethylketal, 2-hydroxy-2-methyl-1-phenyl-propane-1-one, methyl-O-benzoylbenzoate, and 1-hydroxycyclohexyl phenyl ketone.

The content ratio between the component (A) (i.e., the water-dispersible latex) and the component (B) (i.e., the rubber) defined by the ratio of the mass of the component (A) to the total mass of the components (A) and (B) (i.e., a mass ratio of A/(A+B)) is within a range of 20 to 90%, preferably within a range of 30 to 80%, and more preferably within a range of 50 to 70%. If the mass ratio is smaller than 20%, a sufficient water development speed could not be achieved. Since the mass ratio is 20% or larger, water development can be carried out at a high speed. This is presumably because of high permeability of the composition to an aqueous developing solution. On the other hand, if the mass ratio is larger than 90%, the image reproducibility of the composition could be low. Since the mass ratio is 90% or smaller, a high image reproducibility is achieved.

The content of the component (C) (i.e., the surfactant) in the photosensitive resin composition defined by the ratio of the mass of the component (C) to the total mass of the components (A), (B), and (C) (i.e., a mass ratio of C/(A+B+C)) is within a range of 0.1 to 20%, preferably within a range of 0.1 to 15%, and more preferably within a range of 0.1 to 10%. If the mass ratio is smaller than 0.1%, a sufficient water development speed could not be obtained. Since the mass ratio is 0.1% or larger, water development can be accomplished in a short period of time. This is presumably because of high permeability of the composition to the aqueous developing solution. On the other hand, if the mass ratio is larger than 20%, the drying property of the composition after water development could be low. Since the mass ratio is 20% or smaller, a high drying property is achieved.

The content of the component (D) (i.e., the photopolymerizable monomer) in the photosensitive resin composition is preferably within a range of 10 to 80 mass % and more preferably within a range of 20 to 50 mass %. When the content is 10 mass % or more, the crosslinking density in the composition on photopolymerization is prevented from being insufficient, and a good image reproducibility and a high ink resistance are imparted to the composition. On the other hand, when the content is 80 mass % or less, a relief pattern formed on the printing plate comprising the composition is prevented from being fragile, and a sufficient flexibility, which is a characteristic feature of a flexographic printing plate, is imparted to the printing plate.

The content of the component (E) (i.e., the photopolymerization initiator) in the photosensitive resin composition is preferably within a range of 0.3 to 5 mass % and more preferably within a range of 0.5 to 3 mass %. When the content is 0.3 mass % or more, photopolymerization of the component (D) proceeds sufficiently, whereby a high-quality image can be obtained. On the other hand, when the content of the component (E) is 5 mass % or less, the composition is prevented from being too photosensitive, whereby an exposure time of the printing plate comprising the composition can be easily controlled.

The photosensitive resin composition according to the preferred embodiment of the present invention may contain a plasticizer (F) in order to impart flexibility to the composition. In addition, containing the plasticizer (F), the hardness of the photosensitive resin composition is reduced, and as a result, the composition can contain an increased amount of the component (D) (i.e., the photopolymerizable monomer). Thus, the ink resistance of the composition is improved.

Examples of the plasticizer include a liquid rubber, an oil, a polyester, and a phosphate compound. A plasticizer that has a good compatibility with the component (A) and the component (B) is especially preferable. Examples of the liquid rubber include a liquid polybutadiene, and a liquid polyisoprene as well as its derivative modified by maleic acid or epoxy group. Examples of the oil include a paraffin, a naphthene, and an aromatic. Examples of the polyester include an adipate polyester. Examples of the phosphate compound include a phosphate ester.

The content of the component (F) (i.e., the plasticizer) in the photosensitive resin composition is preferably within a range of 0.1 to 30 mass %, and more preferably within a range of 5 to 20 mass %. When the content is 0.1 mass % or more, flexibility is imparted to the composition, whereby swelling of the composition by a solvent ink is suppressed, whereby resistance to a solvent ink (i.e., resistance to swelling by a solvent ink) of the composition is improved. On the other hand, when the content is 30 mass % or less, toughness of the composition is ensured.

The photosensitive resin composition according to the preferred embodiment of the present invention may further contain a thermopolymerization inhibitor (i.e., a stabilizer) in order to improve the thermal stability on kneading and storage stability of the composition. Examples of thermopolymerization inhibitor include a phenol type, a hydroquinone type, and a catechol type thermopolymerization inhibitors. The content of the thermopolymerization inhibitor in the composition is generally within a range of 0.001 to 5 mass %.

In order to improve various properties of the composition, the photosensitive resin composition may further contain other additives such as an ultraviolet absorber, a pigment, a defoaming agent, and a flavor, within a range of not impairing the object of the preferred embodiment of the present invention.

The photosensitive resin composition according to the preferred embodiment of the present invention, having the content described above, comprises a dispersed phase consisting mainly of the component (B) (i.e., the rubber) that is finely dispersed in a matrix phase consisting mainly of the component (A) (i.e., the water-dispersible latex). To be specific, comprising the above-described specific components at the specific content ratio, the composition comprises a dispersed phase consisting mainly of the component (B) and having a size of 10 μm or smaller. The size of the dispersed phase is preferably 5 μm or smaller and more preferably 3 μm or smaller. If the size is larger than 10 μm, the dispersion could be too coarse, and it could be difficult to reproduce a fine structure in an image. Thus, the image reproducibility could be low. Since the size is 10 μm or smaller, a fine structure can be excellently reproduced, whereby an excellent image reproducibility is achieved.

The size of the dispersed phase is defined by the maximum length of the dispersed phase measured on observation of the photosensitive resin composition in an arbitrary field of view. The dispersed phase can be observed for example with a scanning probe microscope (SPM) of an atomic force microscope (AFM) type in a phase mode.

The photosensitive resin composition according to the preferred embodiment of the present invention may be prepared by dehydrating a mixture of components (A) to (E) while kneading the mixture. Alternatively, the composition may be prepared first by dehydrating the component (A) and subsequently by kneading the mixture of the polymer derived from the component (A) together with the components (B) to (E). If the component (F) and/or other ingredients are blended into the composition in addition to the components (A) to (E), the composition may be prepared by kneading a mixture of the components (A) to (E), the component (F), and the other ingredients. Examples of a kneading device used in the kneading process include a twin-screw extruder, a single-screw extruder, kneader, and a Banbury mixer.

Next, a description of a printing plate precursor according to a preferred embodiment of the present invention will be provided.

The printing plate precursor according to the preferred embodiment of the present invention comprises a photosensitive layer made of the photosensitive resin composition according to the preferred embodiment of the present invention. The precursor may be used for so-called analog printing, in which a negative film (having an image formed in advance) is contacted with the photosensitive layer. The precursor may also be used for so-called laser ablation mask (LAM) printing, included in so-called computer-to-plate (CTP) printing. The precursor used for LAM printing has an infrared ablation layer contacted with the photosensitive layer.

The printing plate precursor for analog printing comprises the following layers stacked on a substrate in the order presented: an adhesion layer that adheres the next-described photosensitive layer to the substrate; a photosensitive layer that comprises the photosensitive resin composition according to the preferred embodiment of the present invention; an antiadhesion layer that prevents the surface of the photosensitive layer from being adhesive; and a protection film that protects the photosensitive resin composition from damages before the precursor is used. Examples of the substrate include a plastic film (or a plastic sheet) such as a PET film; a sheet of a metal such as a stainless steel and aluminum; and a sheet of a rubber such as a butadiene rubber. When the precursor is used for analog printing, the protection film is removed off and a negative film on which an image is formed in advance is set in contact with the uncovered antiadhesion layer.

To prepare the printing plate precursor for analog printing, for example, an adhesive is applied onto one side of the substrate, and an antiadhesive material is applied onto one side of the protection film in advance. The photosensitive resin composition according to the preferred embodiment of the present invention is sandwiched between the substrate covered with the adhesive and the protection film covered with the antiadhesive material, and pressed until the composition has a predetermined thickness.

The precursor for LAM printing differs from the precursor for analog printing only in that the precursor for LAM printing comprises an infrared ablation layer between a photosensitive layer and a protection film, while the other features are the same as the features of the precursor for analog printing. To be specific, the precursor for LAM printing comprises an adhesion layer, a photosensitive layer, an infrared ablation layer, and a protection film stacked on a substrate in the order presented. When the precursor is used for LAM printing, the protection film is peeled off to uncover the infrared ablation layer.

A portion of the infrared ablation layer can be removed by irradiation with an infrared laser beam. At the same time, the infrared ablation layer itself acts to block ultraviolet transmission at a practical level. Thus, the infrared ablation layer works as a negative (or a positive) film when an image is formed on the layer.

The infrared ablation layer comprises a resin or a rubber as a binder, an infrared absorbing material, an ultraviolet absorbing material, and a plasticizer. The infrared ablation layer may be prepared by applying a solution of the above-presented materials in a solvent onto the substrate and by dry-removing the solvent.

To prepare the printing plate precursor for LAM printing, for example, an adhesive is applied onto one side of the substrate, and the infrared ablation layer is formed on one side of the protection film in advance. The photosensitive resin composition according to the preferred embodiment of the present invention is sandwiched between the substrate covered with the adhesive and the protection film covered with the infrared ablation layer, and pressed until the composition has a predetermined thickness.

The photosensitive layers of the both types of printing plate precursors preferably have thicknesses of 0.01 to 10 mm. When the thicknesses are 0.01 mm or larger, sufficient relief depths are ensured. On the other hand, when the thicknesses are 10 mm or smaller, the weights of the precursors are suppressed, and thus the precursors can be practically used for printing.

Next, a description of a flexographic printing plate according to a preferred embodiment of the present invention will be provided.

The flexographic printing plate according to the preferred embodiment of the present invention is formed from the printing plate precursor according to the preferred embodiment of the present invention, which comprises the photosensitive layer made of the photosensitive resin composition according to the preferred embodiment of the present invention. To be specific, the flexographic printing plate is prepared by forming a relief image on the photosensitive layer of the printing plate precursor.

To form a relief image on the photosensitive layer of the printing plate precursor, the precursor is first exposed to ultraviolet rays on the substrate side, (i.e., back exposure is carried out).

When the precursor is one for analog printing, the protection film is then peeled off, and a negative film on which an image is previously formed is contacted with the uncovered antiadhesion layer. Meanwhile, when the precursor is one for LAM printing, the protection film is then peeled off, and a predetermined image is formed on the uncovered infrared ablation layer for example by irradiation with an infrared laser beam.

Then, the photosensitive layer is exposed to ultraviolet rays through the negative film or the infrared ablation layer, whereby the photosensitive layer is cured (i.e., main exposure is carried out). The ultraviolet exposure may usually be carried out with an ultraviolet source that provides ultraviolet rays having a wavelength of 300 to 400 nm such as a high-pressure mercury lamp, ultrahigh-pressure mercury lamp, a metal halide lamp, a xenon lamp, a carbon arc lamp, and a chemical lamp. Portion of the photosensitive resin composition irradiated with the ultraviolet rays are cured. The photosensitive layer covered with the negative film or the infrared ablation layer thus has cured portions that have been irradiated with the ultraviolet rays and uncured portions that have not been irradiated with the ultraviolet rays.

Subsequently, the uncured portions of the photosensitive layer are removed in a developing solution to obtain a relief image. An aqueous developing solution is used as the developing solution. The aqueous developing solution comprises water and an additive such as a surfactant and a pH control chemical as necessary. The uncured portions of the photosensitive layer can be removed by rinsing with a device such as a spray-type developing devise and a brush-type rinsing device.

Then, the printing plate thus obtained is taken out of the developing solution and dried. Finally, the whole portion of the printing plate is exposed to ultraviolet rays (i.e., post-exposure is carried out) as necessary. Thus, the flexographic printing plate is obtained.

EXAMPLE

A description of the present invention will now be specifically provided with reference to Examples. It is to be noted that the present invention is not limited to Examples.

(Material Used)
<Component (A)>
Polymer derived from latex dispersion of water (manuf.: ZEON CORPORATION, trade name: "NIPOL LX111NF")
<Component (B)>
NBR: manuf.: ZEON CORPORATION, trade name: "NIPOL DN401"
BR: manuf.: ZEON CORPORATION, trade name: "NIPOL BR1220"

<Component (C)>
Surfactant: manuf.: KAO CORPORATION, trade name: "EMAL 0"
<Component (D)>
Acrylic modified liquid BR: manuf.: OSAKA ORGANIC CHEMICAL INDUSTRY LTD., trade name: "BAC-45"
Acrylic monomer: manuf.: NOF CORPORATION, 1,9-nonanedioldimethacrylate
<Component (E)>
Photopolymerization initiator: manuf.: CIBA SPECIALTY CHEMICALS INC., trade name: "IRGACURE 651"
<Component (F)>
Plasticizer: manuf.: ESSO SEKIYU K.K., trade name: "CRYSTOL 70"
<Other Ingredients>
Thermopolymerization inhibitor (hydroquinone monomethyl ether): manuf.: SEIKO CHEMICAL CORPORATION, trade name: "MEHQ"
Ultraviolet absorber: manuf.: CIBA SPECIALTY CHEMICALS INC., trade name: "TINUVIN 326"

Example 1

Preparation of Photosensitive Resin Composition 45.5 parts by mass of the latex dispersion in water (containing 25 parts by mass of the polymer as a solid content), 15 parts by mass of the acrylic modified liquid BR, and 5 parts by mass of the acryl monomer were mixed and dewatered in a drier at 120° C. for 2 hours to obtain a mixture of the polymer derived from the latex dispersion and the photopolymerizable monomers. The obtained mixture was kneaded with 30 parts by mass of the NBR and 2 parts by mass of the surfactant in a kneader for 45 minutes. Then, 0.2 parts by mass of the thermopolymerization inhibitor, 1 part by mass of the photopolymerization initiator, and 0.03 parts by mass of the ultraviolet absorber were supplied into the kneader, and all were kneading for 5 minutes to give a photosensitive resin composition according to Example 1.

<Preparation of Printed Plate Precursor>

The photosensitive resin composition prepared above was sandwiched between a substrate of a 125-µm thick PET film coated with an adhesive on one side and a protection film of a 100-µm thick PET film coated with an antiadhesive material on one side. Then the composition was pressed with a pressing device heated at 120° C. until the thickness of the composition was 1 mm. Thus obtained was a printing plate precursor according to Example 1, which comprises an adhesion layer, a photosensitive layer consisting of the photosensitive resin composition, an antiadhesion layer, and a protection film stacked on the substrate in the order presented.

<Preparation of Flexographic Printed Plate>

The printing plate precursor prepared above was exposed to light on the substrate side (i.e., back exposure was carried out) for 30 seconds in an exposing device having fifteen 20-W chemical lamps with the precursor placed 15 cm apart from the lamps. Then the protection film was peeled off and a negative film for image reproducibility evaluation (i.e., a negative film that comprises a pattern having a 2% dot at 175 lpi and a 2% dot at 150 lpi) was airtightly contacted with the photosensitive layer. The photosensitive layer was exposed to light through the negative film (i.e., main exposure was carried out) for 10 minutes in the above-mentioned exposing device with the plate placed 15 cm apart from the lamps. Then, the printing plate was developed in a brush-type rinsing device filled with water (water temperature: 50° C.) for 5 minutes. Then, the printing plate was dried with air heated to 60° C. until the plate was dewatered. Finally, the plate was exposed to light (i.e., post-exposure was carried out) for 10 minutes in the above-mentioned exposing device with the plate placed 15 cm apart from the lamps. Thus, a flexographic printing plate according to Example 1 was obtained.

Examples 2 to 11, Comparative Examples 1 to 4

Photosensitive resin compositions according to Examples 2 to 11 and Comparative Examples 1 to 4 were prepared in the same manner as the composition according to Example 1 to have the content compositions shown in Tables 1 and 2. Then, printing plate precursors and flexographic printing plates were prepared in the same manner as those according to Example 1.

Comparative Example 5

Photosensitive resin composition according to Comparative Example 5 was prepared in the same manner as the composition according to Example 1 except that the mixture of the hydrophobic polymer and the photopolymerizable monomer was kneaded with the NBR and the surfactant for 15 minutes instead of for 45 minutes. Then, a printing plate precursor and a flexographic printing plate according to Comparative Example 5 were prepared in the same manner as those according to Example 1.

Example 12

Preparation of Photosensitive Resin Composition

A photosensitive resin composition according to Examples 12 was prepared in the same manner as the composition according to Example 1 to have the content composition shown in Table 1.

<Preparation of Stacked Structure of Infrared Ablation Layer/Protection Film>

28.8 parts by mass of carbon black (manuf.: MITSUBISH CHEMICAL CORPORATION, trade name: "MA8"), 28.8 parts by mass of acrylic resin (manuf.: NEGAMI CHEMICAL INDUSTRIAL CO., LTD., trade name: "HI PEARL M-4501"), and 4.5 parts by mass of plasticizer (manuf.: WAKO PURE CHEMICAL INDUSTRIES, LTD., O-acetyl tributyl citrate) were mixed with 105.2 parts by mass of methylisobutyl ketone by a blade impeller. The obtained liquid mixture was dispersed with a triple roll mill. Methylisobutyl ketone was added to the obtained dispersion mixture to obtain a coating material having a solid content of 15 mass %. Then, the coating material was applied onto a 100-μm thick PET film with a bar coater to have a thickness after dried of 2 μm, and the film was dried at 120° C. for 5 minutes to obtain a stacked structure of infrared ablation layer/protection film was obtained.

<Preparation of Printed Plate Precursor>

A printing plate precursor according to Example 12 was prepared in the same manner as the precursor according to Example 1 except that a protection film of a 100-μm thick PET film covered with the infrared ablation layer on one side was used instead of the protection film used in Example 1 and that the photosensitive resin composition was sandwiched between the protection film and the substrate. Thus obtained a printing plate precursor according to Example 12, which comprises an adhesion layer, a photosensitive layer consisting of the photosensitive resin composition, an infrared ablation layer, and a protection film stacked on the substrate in the order presented.

<Preparation of Flexographic Printed Plate>

A flexographic printing plate according to Example 12 was obtained in the same manner as the plate according to Example 1 except that a negative film was formed such that a pattern having a 2% dot at 175 lpi and a 2% dot at 150 lpi was formed on the infrared ablation layer by a infrared laser beam after back exposure was carried out and the protection film was peeled off and except that the photosensitive layer was subjected to main exposure through the negative film thus formed.

(Evaluation)

<Development Speed>

The development speed of each of the flexographic printing plate according to Examples and Comparative Examples was measured. The development speed was defined by the relief depth of the printing plate (i.e., the difference between the thickness of the plate before development and the thickness of a recessed portion on the plate formed by the development, having a unit of μm) obtained by development for 1 minute in the brush-type rinsing device filled with water (water temperature: 50° C.). The printing plate whose development speed was lower than 50 μm/minute was regarded as bad. The printing plate whose development speed was 50 μm/minute or higher and lower than 100 μm/minute was regarded as moderate. The printing plate whose development speed was 100 μm/minute or higher and lower than 300 μm/minute was regarded as good. The printing plate whose development speed was 300 μm/minute or higher was regarded as excellent.

<Drying Property>

The periods required for dewatering of the flexographic printing plates according to Examples and Comparative Examples with air heated to 60° C. were measured in the drying process after the water development. When the period was shorter than 5 minutes, the printing plate was regarded as good. When the period was 5 minutes or longer, the printing plate was regarded as bad.

<Image Reproducibility>

The flexographic printing plate according to Examples and Comparative Examples were observed with an optical microscope ("VH 8000" manufactured by KEYENCE CORPORATION, magnification: 100×), and it was examined whether or not the dots formed on the negative film were reproduced. The printing plate on which each of the dots was reproduced was regarded as good. The printing plate on which each of the dots was reproduced was regarded as bad. The printing plate for which the evaluation of image reproducibility was not possible due to insufficient development was regarded as unevaluable.

<Swelling Ratio>

The swelling properties of the flexographic printing plate according to Examples and Comparative Examples against a solvent ink were evaluated. To be specific, the swelling ratio of each of the printing plates was calculated based on mass increase of the printing plate after immersed in ethyl acetate, which is contained in an ink, for 24 hours at room temperature (i.e., at 25° C.). More specifically, the swelling ratio was defined by {(mass after immersion)−(mass before immersion)}/(mass before immersion). The printing plate whose swelling ratio was 50% or smaller was regarded as excellent. The printing plate whose swelling ratio was larger than 50% and smaller than 70% was regarded as good. The printing plate whose swelling ratio was 70% or larger and smaller than 100% was regarded as moderate. The printing plate whose swelling ratio was 100% or larger was regarded as bad.

<Shore A Hardness>

The shore A hardness of the photosensitive resin compositions according to Examples and Comparative Examples were measured in accordance with JIS K6253.

<Size of Dispersed Phase>

Surface of the photosensitive layer made of each of the photosensitive resin compositions according to Examples and Comparative Examples was observed with a scanning probe microscope ("SPM-9500J3" manufactured by SHIMADZU CORPORATION) in a phase mode in a field of view of 30 μm×30 μm, and the maximum size of the dispersed phase observed was evaluated. The composition whose dispersed phase had a maximum size of 10 μm or smaller was regarded as good, and the composition whose dispersed phase had a maximum size of larger than 10 μm was regarded as bad.

The content ratios of the photosensitive resin compositions according to Examples and Comparative Examples and the results of the evaluations are shown in Tables 1 and 2. In addition, the surface images of the photosensitive layers formed from the photosensitive resin compositions according to Examples 1, 4, 7, and 8 and Comparative Examples 1, 2, and 5 observed with the scanning probe microscope in the phase mode are shown in FIGS. 1 and 2, which exhibit the states of the dispersed phases.

Figure 2A:
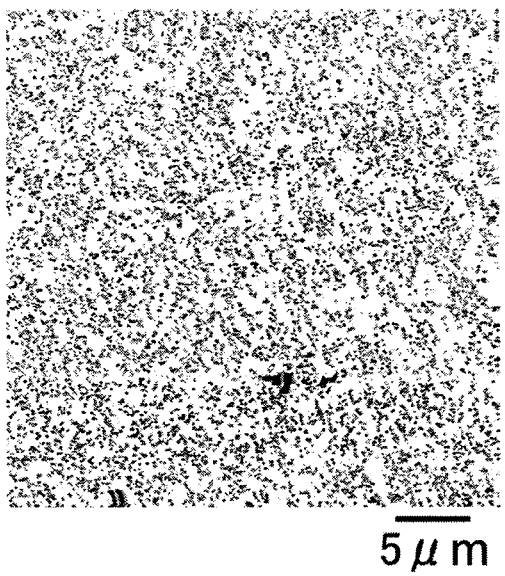
FIGS. 2A, 2B, and 2C correspond to Comparative Examples 1, 2, and 5, respectively.
Figure 2B:
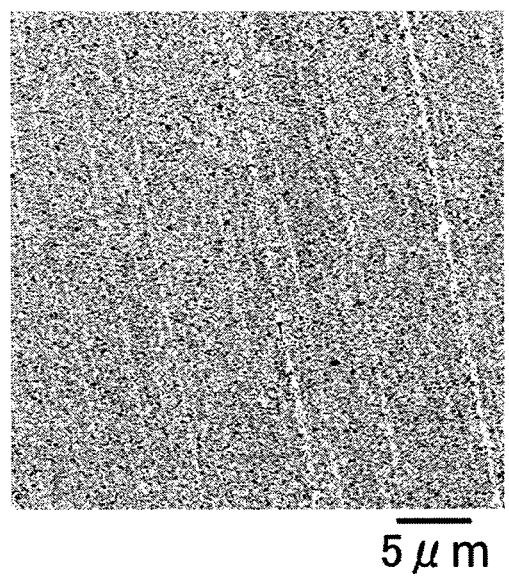
Figure 2C:
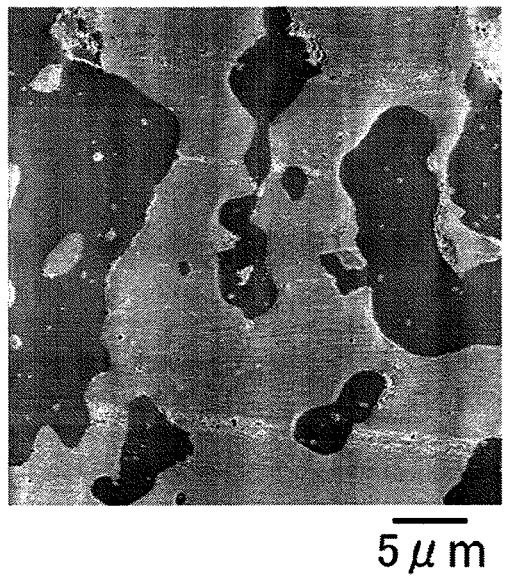

The images corresponding to Examples 1, 4, 7, and 8 are shown in FIGS. 1A, 1B, 1C, and 1D, respectively. The images corresponding to Comparative Examples 1, 2, and 5 are shown in FIGS. 2A, 2B, and 2C, respectively. The images are 30 μm square. In the images corresponding to Examples 1 and 7 and Comparative Example 5, in which the photosensitive resin compositions contain NBR as the component (B), relatively bright areas correspond to phases mainly consisting of the component (A), while a relatively dark areas correspond to phases mainly consisting of the component (B) (i.e., dispersed phases). Meanwhile, in the images corresponding to Examples 4 and 8 and Comparative Example 1, in which the photosensitive resin compositions contain BR as the component (B), relatively bright areas correspond to phases mainly consisting of the component (B) (i.e., dispersed phases), while relatively dark areas correspond to phases mainly consisting of the component (A).

TABLE 1

| Component | | 1 | 2 | 3 | 4 | 5 | 6 | 7 | 8 | 9 | 10 | 11 | 12 |
|---|---|---|---|---|---|---|---|---|---|---|---|---|---|
| (B) | NBR | 30 | 30 | 15 | — | — | — | 30 | — | — | 40 | — | — |
| (B) | BR | — | — | — | 30 | 30 | 15 | — | 30 | 15 | — | 40 | 30 |
| (A) | Water-dispersible latex | 25 | 25 | 40 | 25 | 25 | 40 | 25 | 25 | 40 | 15 | 15 | 25 |
| (C) | Surfactant | 2 | 4 | 4 | 2 | 4 | 4 | 2 | 2 | 4 | 2 | 2 | 2 |
| (D) | Acrylic modified liquid BR | 15 | 15 | 15 | 15 | 15 | 15 | 15 | 15 | 15 | 15 | 15 | 15 |
| (D) | Acrylic monomer | 5 | 5 | 5 | 5 | 5 | 5 | 15 | 15 | 15 | 5 | 5 | 15 |
| (F) | Plasticizer | — | — | — | — | — | — | 15 | 15 | 15 | — | — | 15 |
| | Thermopolymerization inhibitor | 0.2 | 0.2 | 0.2 | 0.2 | 0.2 | 0.2 | 0.2 | 0.2 | 0.2 | 0.2 | 0.2 | 0.2 |
| (E) | Photopolymerization initiator | 1 | 1 | 1 | 1 | 1 | 1 | 1 | 1 | 1 | 1 | 1 | 1 |
| | Ultraviolet absorber | 0.03 | 0.03 | 0.03 | 0.03 | 0.03 | 0.03 | 0.03 | 0.03 | 0.03 | 0.03 | 0.03 | 0.03 |
| Mass ratio of A/(A + B) (%) | | 45 | 45 | 73 | 45 | 45 | 73 | 45 | 45 | 73 | 27 | 27 | 45 |
| Mass ratio of C/(A + B + C) (%) | | 4 | 7 | 7 | 4 | 7 | 7 | 4 | 4 | 7 | 4 | 4 | 4 |
| Development speed (μm/min.) | | 266 | 321 | 651 | 213 | 300 | 586 | 310 | 245 | 591 | 88 | 90 | 222 |
| Evaluation | | Good | Excellent | Excellent | Good | Excellent | Excellent | Good | Good | Excellent | Moderate | Moderate | Good |
| Drying property | | Good | Good | Good | Good | Good | Good | Good | Good | Good | Good | Good | Good |
| Image reproducibility | | | | | | | | | | | | | |
| 2% dot at 175 lpi | | Bad | Bad | Bad | Good | Good | Good | Bad | Good | Good | Bad | Good | Good |
| 2% dot at 150 lpi | | Good | Good | Good | Good | Good | Good | Good | Good | Good | Good | Good | Good |
| Swelling ratio (%) | | 91 | 91 | 96 | 62 | 62 | 68 | 67 | 39 | 40 | 88 | 55 | 39 |
| Evaluation | | Moderate | Moderate | Moderate | Good | Good | Good | Good | Excellent | Excellent | Moderate | Good | Excellent |
| Shore A hardness | | 77 | 77 | 77 | 77 | 77 | 77 | 78 | 77 | 76 | 77 | 77 | 77 |
| Size of dispersed phase | | Good | Good | Good | Good | Good | Good | Good | Good | Good | Good | Good | Good |

TABLE 2

| Component | | Comparative Example 1 | 2 | 3 | 4 | 5 |
|---|---|---|---|---|---|---|
| (B) | NBR | — | — | — | — | 30 |
| (B) | BR | 45 | — | 30 | 30 | — |
| (A) | Water-dispersible latex | 10 | 55 | 25 | 25 | 25 |
| (C) | Surfactant | 2 | 2 | 0 | 15 | 2 |
| (D) | Acrylic modified liquid BR | 15 | 15 | 15 | 15 | 15 |
| (D) | Acrylic monomer | 5 | 5 | 5 | 5 | 5 |

TABLE 2-continued

|  | Component | Comparative Example | | | | |
|---|---|---|---|---|---|---|
|  |  | 1 | 2 | 3 | 4 | 5 |
| (F) | Plasticizer | — | — | — | — | — |
|  | Thermopolymerization inhibitor | 0.2 | 0.2 | 0.2 | 0.2 | 0.2 |
| (E) | Photopolymerization initiator | 1 | 1 | 1 | 1 | 1 |
|  | Ultraviolet absorber | 0.03 | 0.03 | 0.03 | 0.03 | 0.03 |
| Mass ratio of A/(A + B) (%) | | 18 | 100 | 45 | 45 | 45 |
| Mass ratio of C/(A + B + C) (%) | | 4 | 4 | 0 | 21 | 4 |
| Development speed (μm/min.) | | 20 | 770 | 24 | 540 | 178 |
| Evaluation | | Bad | Excellent | Bad | Excellent | Good |
| Drying property | | Good | Good | Good | Bad | Good |
| Image reproducibility | | | | | | |
| 2% dot at 175 lpi | | Unevaluable | Bad | Unevaluable | Good | Bad |
| 2% dot at 150 lpi | | Unevaluable | Bad | Unevaluable | Good | Bad |
| Swelling ratio (%) | | 54 | 60 | 57 | 51 | 95 |
| Evaluation | | Good | Good | Good | Good | Moderate |
| Shore A hardness | | 78 | 79 | 78 | 76 | 77 |
| Size of dispersed phase | | Good | | Good | Good | Bad |

The flexographic printing plate according to Comparative Example 1 is inferior in the development speed because the content of the water-dispersible latex in the photosensitive resin composition is too little. The image reproducibility evaluation was not possible because the development speed was so low that the development was insufficient. The flexographic printing plate according to Comparative Example 2 is inferior in image reproducibility because the content of the surfactant in the photosensitive resin composition is too much.

The flexographic printing plate according to Comparative Example 3 is inferior in development speed because the photosensitive resin composition does not contain a surfactant. A result of image reproducibility evaluation was not possible because the development speed was so low that the development was insufficient. Meanwhile the flexographic printing plate according to Comparative Example 4 is inferior in drying property because the photosensitive resin composition contains too much surfactant, whereby the printing plate is inferior in practical utility.

The flexographic printing plate according to Comparative Example 5 is inferior in image reproducibility because the size of the dispersed phase in the photosensitive resin composition is larger than 10 μm as shown in FIG. 2C, which is too large.

In contrast, the flexographic printing plates according to Examples are excellent in image reproducibility, drying property, and image reproducibility. This result holds true for the flexographic printing plates both for so-called analog printing (Examples 1 to 11) and for so-called LAM printing (Example 12). The sizes of the dispersed phases were 1 μm or smaller in all of the images corresponding to Examples.

Only the surface observation images of the photosensitive resin compositions according to Examples 1, 4, 7, and 8 are presented in FIG. 1. However, it was confirmed that the composition according to Examples 2, 3, and 10, having the same rubber content (B) as the compositions according to Examples 1 and 7, give similar images to the images corresponding to those Examples (i.e., have similar sized dispersed phases). Meanwhile, it was confirmed that the compositions according to Examples 5, 6, 9, and 11, having the same rubber content (B) as the compositions according to Examples 4 and 8, give similar images to the images corresponding to those Examples (i.e., have similar sized dispersed phases).

Comparison among the surface observation images according to Examples indicates that the photosensitive resin compositions containing BR as the component (B) have smaller sized dispersed phases and is more excellent in image reproducibility than in cases of the compositions containing NBR. The results of the image reproducibility evaluations show that when the compositions contain BR as the component (B), both of the 2% dot at 175 lpi and the 2% dot at 150 lpi are reproduced on the flexographic printing plate, and a finer structure is excellently reproduced than in case the compositions contain NBR.

Comparison of Examples 1 to 3 to Example 10 indicates that when the ratio of the mass of the water-dispersible latex (A) to the total mass of the water-dispersible latex (A) and the rubber (B) is 30% or larger, the photosensitive resin compositions are more excellent in image reproducibility than in case the ratio is smaller than 30%. Comparison of Examples 4 to 6 to Example 11 shows the same tendency.

The flexographic printing plates according to Examples 7 to 9 have improved swelling properties because the photosensitive resin compositions contain the plasticizer, whereby the printing plate have improved ink resistance.

The foregoing description of the preferred embodiments of the present invention has been presented for purposes of illustration and description; however, it is not intended to be exhaustive or to limit the present invention to the precise form disclosed, and modifications and variations are possible as long as they do not deviate from the principles of the present invention.

The invention claimed is:
1. A photosensitive resin composition comprising
a water-dispersible latex (A), a rubber (B) other than a (meth)acrylic polymer, a sulfonate surfactant (C), a photopolymerizable component (D) comprising a (meth)acrylic modified polymer, and a photopolymerization initiator (E), wherein
a polymer content of the composition other than the (meth)acrylic polymer consists of the components (A) and (B),
a ratio of a mass of the component (C) to a total mass of the components (A), (B), and (C) is within a range of 0.1 to 20%, a ratio of a mass of the component (A) to a total mass of the components (A) and (B) is within 20 to 90%, and a size of a dispersed phase consisting mainly of the component (B) is 10 μm or smaller.

2. A photosensitive resin composition according to claim 1, wherein the ratio of the mass of the component (C) to the total mass of the components (A), (B), and (C) is within a range of 4 to 20%.

3. The photosensitive resin composition according to claim 2, wherein the composition has a swelling ratio of 50% or smaller against a solvent ink for flexographic printing after the composition is cured.

4. The photosensitive resin composition according to claim 3, wherein the photosensitive resin composition further contains 0.1 to 30 mass % of a plasticizer (F).

5. The photosensitive resin composition according to claim 4, wherein the component (F) is a paraffin oil.

6. The photosensitive resin composition according to claim 5, wherein the component (B) comprises one or more rubbers selected from butadiene rubbers and nitrile rubbers.

7. The photosensitive resin composition according to claim 2, wherein the photosensitive resin composition further contains 0.1 to 30 mass % of a plasticizer (F).

8. The photosensitive resin composition according to claim 7, wherein the component (F) is a paraffin oil.

9. The photosensitive resin composition according to claim 8, wherein the component (B) comprises one or more rubbers selected from butadiene rubbers and nitrile rubbers.

10. The photosensitive resin composition according to claim 1, wherein the composition has a swelling ratio of 50% or smaller against a solvent ink for flexographic printing after the composition is cured.

11. The photosensitive resin composition according to claim 10, wherein the photosensitive resin composition further contains 0.1 to 30 mass % of a plasticizer (F).

12. The photosensitive resin composition according to claim 11, wherein the component (F) is a paraffin oil.

13. The photosensitive resin composition according to claim 12, wherein the component (B) comprises one or more rubbers selected from butadiene rubbers and nitrile rubbers.

14. The photosensitive resin composition according to claim 1, wherein the photosensitive resin composition further contains 0.1 to 30 mass % of a plasticizer (F).

15. The photosensitive resin composition according to claim 14, wherein the component (F) is a paraffin oil.

16. The photosensitive resin composition according to claim 15, wherein the component (B) comprises one or more rubbers selected from butadiene rubbers and nitrile rubbers.

17. A printing plate precursor comprising a photosensitive layer made of the photosensitive resin composition according to claim 2.

18. A flexographic printing plate made from the printing plate precursor according to claim 17.

19. A printing plate precursor comprising a photosensitive layer made of the photosensitive resin composition according to claim 1.

20. A flexographic printing plate made from the printing plate precursor according to claim 19.

21. The photosensitive resin composition according to claim 1, wherein the photopolymerizable component (D) further comprises a (meth)acrylic monomer.

22. The photosensitive resin composition according to claim 21, wherein the amount of the (meth)acrylic monomer is 5 to 15 parts by mass with respect to 15 parts by mass of the (meth)acrylic modified polymer.

23. The photosensitive resin composition according to claim 1, wherein the photopolymerizable component (D) further comprises a (meth)acrylic oligomer.

* * * * *

UNITED STATES PATENT AND TRADEMARK OFFICE
CERTIFICATE OF CORRECTION

PATENT NO.         : 8,492,449 B2  
APPLICATION NO.    : 13/558682  
DATED              : July 23, 2013  
INVENTOR(S)        : Daisuke Inoue et al.

It is certified that error appears in the above-identified patent and that said Letters Patent is hereby corrected as shown below:

In the Claims,

At column 16, line 59 (claim 1, line 3) of the printed patent, "(meth)acrylic polymer" should read ---(meth)acrylic modified polymer---.

At column 16, lines 64-65 (claim 1, lines 7-8) of the printed patent, "acrylic polymer" should read ---acrylic modified polymer---.

Signed and Sealed this  
Fifteenth Day of September, 2015

Michelle K. Lee  
*Director of the United States Patent and Trademark Office*